United States Patent
Watanabe et al.

(10) Patent No.: US 9,716,026 B2
(45) Date of Patent: Jul. 25, 2017

(54) RESIN COMPOSITION, CURED FILM, LAMINATED FILM, AND METHOD FOR MANUFACTURING SEMICONDUCTOR DEVICE

(71) Applicant: TORAY Industries, Inc., Tokyo (JP)

(72) Inventors: Takuo Watanabe, Seoul (KR); Chungseon Lee, Gwangju (KR)

(73) Assignee: TORAY INDUSTRIES, INC., Tokyo (JP)

( * ) Notice: Subject to any disclaimer, the term of this patent is extended or adjusted under 35 U.S.C. 154(b) by 26 days.

(21) Appl. No.: 14/430,361

(22) PCT Filed: Sep. 25, 2013

(86) PCT No.: PCT/JP2013/075886
§ 371 (c)(1),
(2) Date: Mar. 23, 2015

(87) PCT Pub. No.: WO2014/050878
PCT Pub. Date: Apr. 3, 2014

(65) Prior Publication Data
US 2015/0228527 A1 Aug. 13, 2015

(30) Foreign Application Priority Data

Sep. 25, 2012 (JP) ................................. 2012-210689

(51) Int. Cl.
| | |
|---|---|
| *B32B 27/34* | (2006.01) |
| *C08G 73/10* | (2006.01) |
| *C09J 7/00* | (2006.01) |
| *H01L 21/683* | (2006.01) |
| *C08K 5/05* | (2006.01) |
| *C09J 179/08* | (2006.01) |
| *C08G 77/455* | (2006.01) |
| *C09J 183/10* | (2006.01) |
| *B32B 27/28* | (2006.01) |
| *H01L 21/302* | (2006.01) |
| *C08L 79/08* | (2006.01) |

(52) U.S. Cl.
CPC ........ *H01L 21/6836* (2013.01); *B32B 27/281* (2013.01); *B32B 27/34* (2013.01);
(Continued)

(58) Field of Classification Search
CPC .... H01L 21/6836; H01L 21/302; C08L 79/08; C09J 183/10; C09J 7/02; C09J 11/06; C09J 179/08; C09J 7/00; C09J 2203/326; C09J 2479/08; C09J 2203/10; B32B 27/34; B32B 27/281; B32B 2457/14; C08G 73/106;
(Continued)

(56) References Cited

U.S. PATENT DOCUMENTS 3,740,305 A * 6/1973 Hoback .................. B32B 17/04
156/329
2005/0014876 A1 1/2005 Fujita et al.
(Continued)

FOREIGN PATENT DOCUMENTS

| JP | 10-265571 A | 10/1998 |
| JP | 2005-43883 A | 2/2005 |

(Continued)

OTHER PUBLICATIONS

International Search Report, issued in PCT/JP2013/075886, dated Dec. 17, 2013.
Written Opinion of the International Searching Authority, issued in PCT/JP2013/075886, dated Dec. 17, 2013.

*Primary Examiner* — Caleen Sullivan
(74) *Attorney, Agent, or Firm* — Birch, Stewart, Kolasch & Birch, LLP

(57) ABSTRACT

[Problem] To provide a highly heat resistant resin composition which exhibits good tackiness at low temperatures less than or equal to 180° C., and whose production of a volatile portion due to decomposition or the like is small even at high temperatures greater than or equal to 250° C., and whose increase in adhesive force is small even after passage through a heat treatment step, and therefore which allows a base material to be easily peeled off at room temperature when the base material is to be peeled off, and a cured membrane and a laminate film that employ this resin composition.
[Solution Means] A resin composition containing a polyimide-based resin and a methylol-based compound, the resin composition being characterized in that the polyimide-based resin has an acid dianhydride residue and a diamine residue, and has as the diamine residue at least a residue of a polysiloxane-based diamine represented by General formula (1) and a residue of an aromatic diamine having a hydroxyl group, and a cured product and a laminate film that employ this resin composition.

[Chem. 1]

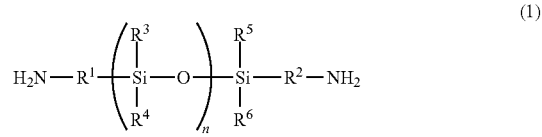

(1)

(n is a natural number, and an average value thereof calculated from an average molecular weight of the polysiloxane-based diamine is in a range of 5 to 30. $R^1$ and $R^2$ may be individually the same or different, indicating an alkylene group or a phenylene group whose carbon number is 1 to 30. $R^3$ to $R^6$ may be individually the same or different, indicating an alkyl group, a phenyl group or a phenoxy group whose carbon number is 1 to 30.)

15 Claims, No Drawings

(52) U.S. Cl.
CPC ....... *C08G 73/106* (2013.01); *C08G 73/1042* (2013.01); *C08G 73/1082* (2013.01); *C08G 77/455* (2013.01); *C08K 5/05* (2013.01); *C08L 79/08* (2013.01); *C09J 7/00* (2013.01); *C09J 179/08* (2013.01); *C09J 183/10* (2013.01); *H01L 21/302* (2013.01); *B32B 2457/14* (2013.01); *C09J 2203/10* (2013.01); *C09J 2203/326* (2013.01); *C09J 2479/08* (2013.01); *Y10T 428/31663* (2015.04)

(58) Field of Classification Search
CPC .............. C08G 73/1042; C08G 77/455; C08G 73/1082; C08K 5/05; Y10T 428/31663
USPC ................... 428/195.1; 438/459; 430/270.1; 524/155; 528/43
See application file for complete search history.

(56) References Cited

U.S. PATENT DOCUMENTS

| | | |
|---|---|---|
| 2006/0079658 A1 | 4/2006 | Kato et al. |
| 2007/0154843 A1* | 7/2007 | Kanada .................. C08G 73/10 430/311 |
| 2010/0304291 A1 | 12/2010 | Ebara |
| 2011/0143103 A1 | 6/2011 | Furuya et al. |

FOREIGN PATENT DOCUMENTS

| | | |
|---|---|---|
| JP | 2006-133757 A | 5/2006 |
| JP | 2007-314647 A | 12/2007 |
| JP | 2011-123278 A | 6/2011 |
| WO | WO 2009/078365 A1 | 6/2009 |

* cited by examiner

RESIN COMPOSITION, CURED FILM, LAMINATED FILM, AND METHOD FOR MANUFACTURING SEMICONDUCTOR DEVICE

TECHNICAL FIELD

The invention relates to a resin composition that is suitable used as a heat resistant tackiness agent, and a cured membrane, laminate film, and a production method for a semiconductor apparatus. More particularly, the invention relates to a resin composition that is suitably used as a heat resistant tackiness agent that is free from production of a volatile portion due to decomposition of a tackiness agent or the like even in a high-temperature environment, and has excellent tackiness, and is usable as a material for use in a process during electronic device production, and to a cured membrane and a laminate film that employ this resin composition.

BACKGROUND ART

As tackiness agents, rubber-based tackiness agents, such as natural rubber and styrene-butadiene rubber, have been generally often used. However, for materials for use in processing steps during electronic device production, which require high heat resistance, acryl-based resin and silicone-based resin have been used.

The acryl-based resin, having high transparency as well, is often used as optical materials for flat displays, such as liquid crystal displays (refer to, e.g., Patent document 1). However, in the case where the acryl-based resin is left standing for a long time at a temperature greater than or equal to 200° C. and, furthermore, greater than or equal to 250° C., the acrylic resin itself decomposes and produces a volatile component; therefore, the acryl-based resin is insufficient in terms of heat resistance. The silicone-based resin has a wide working temperature range from low temperature to high temperature, and exhibits high heat resistance as compared with the acryl-based resin (refer to, e.g., Patent document 2). However, in the case of being left standing for a long time at a temperature greater than or equal to 250° C. and, furthermore, greater than or equal to 300° C., the silicone-based resin produces a volatile component due to decomposition or the like. Furthermore, since the silicone-based tackiness agent contains silicone components of low molecular weight, there is a problem of these components adversely affecting electronic component parts.

As resins having a heat resistance for 250° C. or higher, polyimide resin can be cited. As a polyimide resin to be used in use as an adhesive, for example, a siloxane-based polyimide resin in which siloxane-based diamine is copolymerized for the purpose of reducing production of gas during cure and developing excellent adhesiveness has been proposed (refer to, e.g., Patent document 3). Furthermore, for the purpose of enabling sticking a semiconductor adhesive tape at temperatures less than or equal to 300° C., a polysiloxane-based polyimide resin in which a diamine component is copolymerized with a polysiloxane-based diamine so that the glass transition temperature is 100 to 150° C. has been proposed (refer to, e.g., Patent document 4).

PRIOR ART DOCUMENT(S)

Patent Document(S)

Patent document 1: Japanese Unexamined Patent Publication (Kokai) No. 2008-308549

Patent document 2: Japanese Unexamined Patent Publication (Kokai) No. 2005-105246

Patent document 3: Japanese Unexamined Patent Publication (Kokai) No. 5-200946

Patent document 4: Japanese Unexamined Patent Publication (Kokai) No. 2004-277619

SUMMARY OF THE INVENTION

Problems to be Solved by the Invention

However, even a polyimide resin whose adhesive force has been enhanced cannot be pressure-bonded to another base material at low temperatures less than or equal to 180° C., and cannot be used as a tackiness agent. Furthermore, although acryl-based or silicone-based tackiness agents allows another base material to be pressure-bonded at low temperatures less than or equal to 180° C., there is a problem of such a tackiness agent increasing in adhesive force after passing through a heat treatment step and the like so that the base material cannot be easily peeled off at room temperature when the base material is to be peeled.

In view of such circumstances, an object of the invention is to provide a resin composition whose production of a volatile portion due to decomposition or the like is small even at high temperatures greater than or equal to 250° C., and which has good tackiness at low temperatures less than or equal to 180° C., and whose increase in adhesive force is small even after passage through a heat treatment step so that the peeling can easily be carried out at room temperature, and a cured product and a laminate film that employ this resin composition.

Means of Solving the Problems

That is, the invention is a resin composition containing a polyimide-based resin and a methylol-based compound, the resin composition being characterized in that the polyimide-based resin has an acid dianhydride residue and a diamine residue, and has as the diamine residue at least a residue of a polysiloxane-based diamine represented by General formula (1) and a residue of an aromatic diamine having a hydroxyl group, and is also a cured product and a laminate film that employ this resin composition.

[Chem. 1]

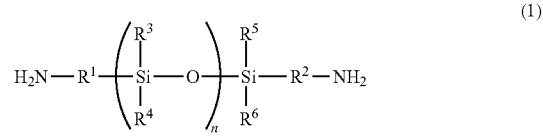

(1)

(n is a natural number, and an average value thereof calculated from an average molecular weight of the polysiloxane-based diamine is in a range of 5 to 30. $R^1$ and $R^2$ may be individually the same or different, indicating an alkylene group or a phenylene group whose carbon number is 1 to 30. $R^3$ to $R^6$ may be individually the same or different, indicating an alkyl group, a phenyl group or a phenoxy group whose carbon number is 1 to 30.)

Advantageous Effect of the Invention

According to the invention, it is possible to provide a highly heat resistant resin composition which exhibits good tackiness at low temperatures less than or equal to 180° C., and whose production of a volatile portion due to decomposition or the like is small even at high temperatures greater than or equal to 250° C., and whose increase in adhesive force is small even after passage through a heat treatment step, and therefore which allows a base material to be easily peeled off at room temperature when the base material is to be peeled off, and a cured membrane and a laminate film that employ this resin composition.

DESCRIPTION OF THE EMBODIMENTS

The resin composition of the invention is one that can be used as a tacky layer laminate film or a tacky layer laminated substrate by laminating resin composition on a heat resistant insulation film, a glass substrate, a silicon wafer, etc.

The resin composition of the invention is a resin containing at least a polyimide-based resin and a methylol-based compound.

The polyimide-based resin in the invention exhibits high heat resistance. The heat resistance in the invention is defined by a decomposition start temperature at which a volatile portion is produced due to decomposition or the like. A preferable decomposition start temperature is greater than or equal to 250° C. and, more preferably, greater than or equal to 300° C.

The decomposition start temperature in the invention can be measured by using a thermogravimetric analysis apparatus (TGA). The measurement method will be specifically described. A predetermined amount of polyimide-based resin is charged into a TGA, and is held at 60° C. for 30 minutes to remove moisture content having been absorbed in the polyimide-based resin. Next, the temperature is raised to 500° C. at 5° C./min. On a weight reduction curve obtained, the temperature at which weight reduction starts is defined as a decomposition start temperature.

The polyimide-based resin in the invention has at least an acid dianhydride residue and a diamine residue. In the invention, as diamine residues, a residue of a polysiloxane-based diamine represented by General formula (1) and a residue of an aromatic diamine having a hydroxyl group are contained.

[Chem. 2]

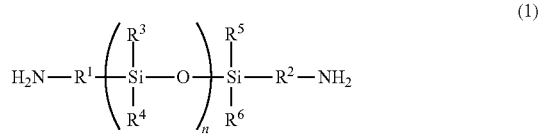

(1)

n is a natural number, and an average value thereof calculated from an average molecular weight of the polysiloxane-based diamine is in a range of 5 to 30. $R^1$ and $R^2$ may be individually the same or different, indicating an alkylene group or a phenylene group whose carbon number is 1 to 30. $R^3$ to $R^6$ may be individually the same or different, indicating an alkyl group, a phenyl group or a phenoxy group whose carbon number is 1 to 30. As preferable alkyl group whose carbon number is 1 to 30, there can be cited a methyl group, an ethyl group, a propyl group, and a butyl group.

The average molecular weight of the polysiloxane-based diamine can be found by calculating an amino group equivalent by neutralization titration of the amino groups of the polysiloxane-based diamine and doubling the amino group equivalent. For example, polysiloxane-based diamine that is a sample is sampled in an predetermined amount and is taken and put in a beaker, and is dissolved in a predetermined amount of a 1:1 mixture solution of isopropyl alcohol (hereinafter, termed IPA) and toluene, and a 0.1-N hydrochloric acid aqueous solution is dropped into this solution while the solution being stirred. From the amount of the 0.1-N hydrochloric acid aqueous solution having been dropped when the neutralization point is reached, the amino group equivalent can be calculated. The value obtained by doubling this amino group equivalent is the average molecular weight.

On the other hand, the molecular weights in the case where the polysiloxane-based diamine is n=1 and in the case where it is n=10 are calculated from the chemical structural formula, and a relation between the numeral value of n and the molecular weight can be obtained as a relational expression of a linear function. By substituting the aforementioned average molecular weight in the relational expression, the average value of the aforementioned n can be obtained.

Furthermore, because the polysiloxane-based diamine indicated by General formula (1) is, in some cases, a mixture where n is not a single value but a plurality of n exists, n represents an average value in the invention. n is in the range of 5 to 30, and n in the range of 7 to 25 is more preferable. Due to n being in the range of 5 to 30, the glass transition temperature of a membrane obtained by curing the resin composition can be adjusted to less than or equal to 40° C. Furthermore, at the time of polymerization of the polyimide-based resin, gelation does not occur.

As specific examples of the polysiloxane-based diamine indicated by General formula (1), there are provided α,ω-bis(3-aminopropyl)polydimethyl siloxane, α,ω-bis(3-aminopropyl)polydiethyl siloxane, α,ω-bis(3-aminopropyl)polydipropyl siloxane, α,ω-bis(3-aminopropyl)polydibutyl siloxane, α,ω-bis(3-aminopropyl)polydiphenoxy siloxane, α,ω-bis(2-aminoethyl)polydimethyl siloxane, α,ω-bis(2-aminoethyl)polydiphenoxy siloxane, α,ω-bis(4-aminobutyl)polydimethyl siloxane, am-bis(4-aminobutyl)polydiphenoxy siloxane, α,ω-bis(5-aminopentyl)polydimethyl siloxane, α,ω-bis(5-aminopentyl)polydiphenoxy siloxane, α,ω-bis(4-aminophenyl)polydimethyl siloxane, α,ω-bis(4-aminophenyl)polydiphenoxy siloxane, etc. The aforementioned polysiloxane-based diamine may be singly or two or more species thereof may be used.

The polyimide-based resin of the invention preferably contain the residue of the polysiloxane-based diamine indicated by General formula (1) at greater than or equal to 40 mol % in the total amount of diamine residue and, more preferably, greater than or equal to 60 mol % and less than or equal to 99 mol %. Because the residue of the polysiloxane-based diamine indicated by General formula (1) is contained at greater than or equal to 40 mol %, the glass transition temperature of a membrane obtained by curing the resin composition can be caused to be 40° C. or less, and good tackiness at low temperatures of 180° C. or less can be exhibited.

The polyimide-based resin of the invention contains, in the total amount of diamine residue, the residue of aromatic diamine having a hydroxyl group at greater than or equal to 1 mol % and, more preferably, greater than or equal to 5 mol %, and less than or equal to 40 mol % and, more preferably, less than or equal to 30 mol %. Because the residue of aromatic diamine having a hydroxyl group is contained at greater than or equal to 1 mol % and less than or equal to 40 mol %, good tackiness is obtained and, furthermore, the rise in adhesive force is small even after passage through a heat treatment step; therefore, the base material can be easily peeled at room temperature when the base material is to be peeled.

In the invention, the aromatic diamine having a hydroxyl group is preferred to be an aromatic diamine represented by any one of General formulas (2) to (5).

[Chem. 3]

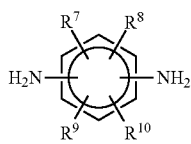

(2)

At least one of $R^7$ to $R^{10}$ is a hydroxyl group, and the others may be the same or different, indicating a group selected from a hydrogen atom, an alkyl group whose carbon number is 1 to 30, an alkoxy group whose carbon number 1 to 30, a halogen, a carboxyl group, a sulfone group, a nitro group, and a cyano group.

[Chem. 4]

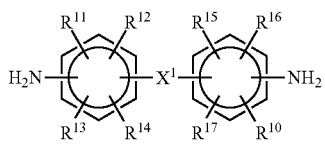

(3)

$X^1$ indicates a group selected from a direct bond, O, S, SO, $SO_2$, CO, $CH_2$, $C(CH_3)_2$ and $C(CF_3)_2$. At least one of $R^{11}$ to $R^{18}$ is a hydroxyl group, and the others may be the same or different, indicating a group selected from a hydrogen atom, an alkyl group whose carbon number is 1 to 30, an alkoxy group whose carbon number 1 to 30, a halogen, a carboxyl group, a sulfone group, a nitro group, and a cyano group.

[Chem. 5]

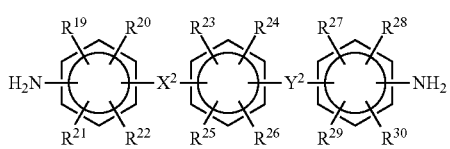

(4)

$X^2$ and $Y^2$ each may be individually the same or different, indicating a group selected from a direct bond, O, S, SO, $SO_2$, CO, $CH_2$, $C(CH_3)_2$ and $C(CF_3)_2$. At least one of $R^{19}$ to $R^{30}$ is a hydroxyl group, and the others may be the same or different, indicating a group selected from a hydrogen atom, an alkyl group whose carbon number is 1 to 30, an alkoxy group whose carbon number 1 to 30, a halogen, a carboxyl group, a sulfone group, a nitro group, and a cyano group.

[Chem. 6]

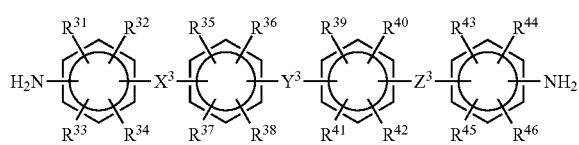

(5)

$X^3$, $Y^3$ and $Z^3$ may be individually the same or different, indicating a group selected from a direct bond, O, S, SO, $SO_2$, CO, $CH_2$, $C(CH_3)_2$ and $C(CF_3)_2$. At least one of $R^{31}$ to $R^{46}$ is a hydroxyl group, and the others may be the same or different, indicating a group selected from a hydrogen atom, an alkyl group whose carbon number is 1 to 30, an alkoxy group whose carbon number 1 to 30, a halogen, a carboxyl group, a sulfone group, a nitro group, and a cyano group.

As specific examples of the aromatic diamine having a hydroxyl group indicated by General formulas (2) to (5), there can be cited 2,5-diaminophenol, 3,5-diaminophenol, 3,3'-dihydroxy benzidine, 4,4'-dihydroxy-3,3'-diaminophenyl propane, 4,4'-dihydroxy-3,3'-diaminophenyl hexafluoropropane, 4,4'-dihydroxy-3,3'-diaminophenyl sulfone, 4,4'-dihydroxy-3,3'-diaminophenyl ether, 3,3'-dihydroxy-4,4'-diaminophenyl ether, 4,4'-dihydroxy-3,3'-diaminophenyl propane methane, 4,4'-dihydroxy-3,3'-diaminobenzophenone, 1,3-bis(4-amino-3-hydroxy phenyl)benzene, 1,3-bis(3-amino-4-hydroxy phenyl)benzene, bis(4-(4-amino-3-hydroxy phenoxy)benzene)propane, bis(4-(3-amino-4-hydroxy phenoxy)benzene)sulfone, bis(4-(3-amino-4-hydroxy phenoxy)biphenyl, etc. The aforementioned aromatic diamine having a hydroxyl group may be singly, or two or more species thereof may be used.

In the invention, besides the residue of polysiloxane-based diamine and the residue of aromatic diamine having a hydroxyl group mentioned, a residue of aromatic diamine or a residue of alicyclic diamine may be present. As specific examples of the aromatic diamine or the alicyclic diamine, there can be cited p-phenylene diamine, m-phenylene diamine, 2,5-diaminotoluene, 2,4-diaminotoluene, 3,5-diaminobenzoic acid, 2,6-diaminobenzoic acid, 2-methoxy-1,4-phenylene diamine, 4,4'-diaminobenzanilide, 3,4'-diaminobenzanilide, 3,3'-diaminobenzanilide, 3,3'-dimethyl-4,4'-diaminobenzanilide, 9,9-bis(4-aminophenyl)fluorene, 9,9-bis(3-aminophenyl)fluorene, 9,9-bis(3-methyl-4-aminophenyl)fluorene, 9,9-bis(3,5-dimethyl-4-aminophenyl)fluorene, 9,9-bis(3-methoxy-4-aminophenyl) fluorene, 9,9-bis(4-aminophenyl)fluorene-4-carboxylic acid, 9,9-bis(4-aminophenyl)fluorene-4-methyl, 9,9-bis(4-aminophenyl)fluorene-4-methoxy, 9,9-bis(4-aminophenyl)fluorene-4-ethyl, 9,9-bis(4-aminophenyl)fluorene-4-sulfone, 9,9-bis(4-aminophenyl)fluorene-3-carboxylic acid, 9,9-bis(4-aminophenyl)fluorene-3-methyl, 1,3-diaminocyclohexane, 2,2'-dimethyl benzidine, 3,3'-dimethyl benzidine, 3,3'-dimethoxy benzidine, 2,4-diaminopyridine, 2,6-diaminopyridine, 1,5-diaminonaphthalene, 2,7-diaminofluorene, p-amino benzylamine, m-amino benzylamine, 4,4'-bis(4-aminophenoxy)biphenyl, 4,4'-diaminodiphenyl ether, 3,3'-diaminodiphenyl ether, 3,4'-diaminodiphenyl ether, 4,4'-diaminodiphenyl sulfone, 3,3'-diaminodiphenyl sulfone, 3,3'-diaminodiphenyl methane, 4,4'-diaminodiphenyl methane, 4,4'-diaminodiphenyl sulfide, 3,3'-diamino 3,4'-diamino benzophenone, 4,4'-diamino benzophenone, 3,3'-dimethyl-4,4'-diaminodiphenyl methane, 1,3-bis(4-aminophenoxy)benzene, 1,3-bis(3-aminophenoxy)benzene, 1,4-bis(4-aminophenoxy)benzene, 1,4-bis(3-aminophenoxy)benzene, 2,2-bis[4-(4-aminophenoxy)phenyl]propane, 2,2-bis[4-(3-aminophenoxy)phenyl]propane, bis[4-(4-aminophenoxy)phenyl]methane, bis[4-(3-aminophenoxy)phenyl]methane, bis[4-(4-aminophenoxy)phenyl]ether, bis [4-(3-aminophenoxy)phenyl]ether, bis[4-(4-aminophenoxy)phenyl]sulfone, bis[4-(3-aminophenoxy)phenyl]sulfone, 2,2-bis[4-(4-aminophenoxy)phenyl]hexafluoropropane, 1,4-diamino cyclohexane, 4,4'-methylene bis(cyclohexyl amine), 3,3'-methylene bis(cyclohexyl amine), 4,4'-diamino-3,3'-dimethyl dicyclohexyl methane, 4,4'-diamino-3,3'-dimethyl dicyclohexyl, benzidine, etc. The aromatic diamine or the alicyclic diamine mentioned above may be singly, or two or more species thereof may be used.

Among these aromatic diamines or alicyclic diamines, aromatic diamines having a structure high in bendability are preferable; specifically, 1,3-bis(3-aminophenoxy)benzene, 3,3'-diaminodiphenyl sulfone, 4,4'-diaminodiphenyl ether, 3,3'-diaminodiphenyl ether and 3,3'-diamino benzophenone are particularly preferable.

The polyimide-based resin in the invention is preferred to contain a residue of aromatic tetracarboxylic dianhydride as an acid dianhydride residue. As specific examples of the aromatic tetracarboxylic dianhydride, there can be cited pyromellitic dianhydride, 3,3',4,4'-biphenyl tetracarboxylic dianhydride, 2,2'dimethyl-3,3',4,4'-biphenyl tetracarboxylic dianhydride, 5,5'dimethyl-3,3',4,4'-biphenyl tetracarboxylic dianhydride, 2,3,3',4'-biphenyl tetracarboxylic dianhydride, 2,2',3,3'-biphenyl tetracarboxylic dianhydride, 3,3',4,4'-diphenyl ether tetracarboxylic dianhydride, 2,3,3',4'-diphenyl ether tetracarboxylic dianhydride, 2,2',3,3'-diphenyl ether tetracarboxylic dianhydride, 3,3',4,4'-benzophenone tetracarboxylic dianhydride, 2,2',3,3'-benzophenone tetracarboxylic dianhydride, 2,3,3',4'-benzophenone tetracarboxylic dianhydride, 3,3',4,4'-diphenyl sulfone tetracarboxylic dianhydride, 2,3,3',4'-diphenyl sulfone tetracarboxylic dianhydride, 3,3',4,4'-diphenyl sulfoxide tetracarboxylic dianhydride, 3,3',4,4'-diphenyl sulfide tetracarboxylic dianhydride, 3,3',4,4'-diphenyl methylene tetracarboxylic dianhydride, 4,4'-isopropylidene diphthalic anhydride, 4,4'-(hexafluoroisopropylidene)diphthalic anhydride, 3,4,9,10-perylene tetracarboxylic dianhydride, 2,3,6,7-naphthalene tetracarboxylic dianhydride, 1,4,5,8-naphthalene tetracarboxylic dianhydride, 1,2,5,6-naphthalene tetracarboxylic dianhydride, 3,3'',4,4''-para-terphenyl tetracarboxylic dianhydride, 3,3'',4,4''-meta-terphenyl tetracarboxylic dianhydride, 2,3,6,7-anthracene tetracarboxylic dianhydride, 1,2,7,8-phenanthrene tetracarboxylic dianhydride, etc. The aforementioned aromatic tetracarboxylic dianhydride may be singly, or two or more species thereof may be used.

Furthermore, in the invention, a tetracarboxylic dianhydride having an aliphatic ring can be contained to such a degree as not to impair the heat resistance of the polyimide-based resin. As specific examples of the tetracarboxylic dianhydride having an aliphatic ring, there can be cited 2,3,5-tricarboxy cyclopentyl acetic dianhydride, 1,2,3,4-cyclobutane tetracarboxylic dianhydride, 1,2,3,4-cyclopentane tetracarboxylic dianhydride, 1,2,3,5-cyclopentane tetracarboxylic dianhydride, 1,2,4,5-bicyclohexene tetracarboxylic dianhydride, 1,2,4,5-cyclohexane tetracarboxylic dianhydride, and 1,3,3a,4,5,9b-hexahydro-5-(tetrahydro-2,5-dioxo-3-furanyl)-naphth[1,2-C]furan-1,3-dion. The aforementioned tetracarboxylic dianhydride may be singly, or two or more species thereof may be used.

Adjustment of the molecular weight of the polyimide-based resin in the invention can be carried out by causing the tetracarboxylic acid component or the diamine component for use in synthesis to be equimolar or causing one of them to be in excess. It is also possible to cause one of the tetracarboxylic acid component or the diamine component to be in excess and seal a polymer chain terminal with a terminal sealant such as an acid component or an amine component. As a terminal sealant of an acid component, a dicarboxylic acid or an anhydride thereof is preferably used. As a terminal sealant of an amine component, a monoamine is preferably used. At this time, it is preferable that the acid equivalent of the tetracarboxylic acid component, including the terminal sealant of an acid component or an amine component, and the amine equivalent of the diamine component be equimolar.

In the case where the molar ratio has been adjusted so that the tetracarboxylic acid component is in excess or the diamine component is in excess, a dicarboxylic acid, such as benzoic acid, phthalic anhydride, tetrachlorophthalic anhydride or aniline, or an anhydride thereof, or a monoamine may be added as a terminal sealant.

In the invention, the molar ratio of tetracarboxylic acid component/diamine component in the polyimide-based resin can be adjusted as appropriate so that the viscosity of the resin solution is in such a range that the resin solution is easy to use in a coating process or the like, and it is typical to adjust the molar ratio of tetracarboxylic acid component/diamine component in the range of 100/100 to 100/95 or 100/100 to 95/100. However, if the molar balance is deteriorated, the molecular weight of the resin declines and the mechanical strength of the formed membrane becomes low, and the tackiness force tends to weaken; therefore, it is preferable to adjust the molar ratio in such a range that the tackiness force does not weaken.

There are no specific limitations on the method for synthesizing the polyimide-based resin of the invention. For example, at the time of polymerizing a polyamide acid that is a precursor of the polyimide-based resin in the invention, tetracarboxylic dianhydride and diamine are stirred in an organic solvent at 0 to 100° C. for 1 to 100 hours to obtain a polyamide acid resin solution. In the case where the composition of the polyimide-based resin is soluble in an organic solvent, the polymerization of polyamide acid is followed directly by a temperature rise to 120 to 300° C. and 1 to 100 hours of stirring so that conversion to polyimide occurs and thus a polyimide-based resin solution is obtained. At this time, toluene, o-xylene, m-xylene, p-xylene, etc. may be added into the reaction solution, and the water produced due to an imidization reaction may be removed by the azeotropy with such a solvent.

As a solvent for synthesis of polyimide or a polyamide acid that is a polyimide precursor, there can be cited, for example, amide-based polar solvents, such as N-methyl-2-pyrrolidone, N,N-dimethyl acetamide and N,N-dimethylformamide, lactone-based polar solvents, such as β-propiolactone, γ-butyrolactone, γ-valerolactone, δ-valerolactone, γ-caprolactone and ε-caprolactone, and furthermore methyl cellosolve, methyl cellosolve acetate, ethyl cellosolve, ethyl cellosolve acetate, methyl carbitol, ethyl carbitol, diethylene glycol dimethyl ether (jig lime), ethyl lactate, etc. These may be used singly, or two or more species thereof may be used. The concentration of the polyimide-based resin solution or the polyamide acid resin solution is normally preferred to be 10 to 80 wt %, and more preferably 20 to 70 wt %.

In the case of a polyamide acid resin solution, the solution is coated on a base material, such as a film or glass, and is dried to form a coating membrane, and then is thermally treated for conversion into polyimide. The conversion from a polyimide precursor into a polyimide requires a temperature greater than or equal to 240°. However, if an imidization catalyst is contained in the polyamide acid resin composition, imidization at lower temperature in a shorter time becomes possible. As specific examples of the imidization catalyst, there can be cited pyridine, trimethyl pyridine, β-picoline, quinoline, isoquinoline, imidazole, 2-methyl imidazole, 1,2-dimethyl imidazole, 2-phenyl imidazole, 2,6-lutidine, triethyl amine, m-hydroxybenzoic acid, 2,4-dihydroxybenzoic acid, p-hydroxy phenylacetic acid, 4-hydroxy phenylpropionic acid, p-phenol sulfonic acid, p-aminophenol, p-aminobenzoic acid, etc.; however, there is no limitation to these.

The imidization catalyst is preferred to be at greater than or equal to 3 parts by weight and, more preferably, greater than or equal to 5 parts by weight, relative to 100 parts by weight of a polyamide acid solid content. Due to containing an imidization catalyst at greater than or equal to 3 parts by weight, even a heat treatment at a lower temperature can complete the imidization. Furthermore, the amount of the imidization catalyst is, preferably, less than or equal to 10 parts by weight and, more preferably, less than or equal to 8 parts by weight. Because the content of the imidization catalyst is less than or equal to 10 parts by weight, the amount of the imidization catalyst residing in the polyimide-based resin layer after the heat treatment can be minimized, so that occurrence of a volatile portion can be restrained.

The resin composition of the invention contains a methylol-based compound. The methylol-based compound is a crosslinking agent, and the crosslinking agent is a compound that, at the time of thermal cure, cross-links the polyimide-based resin and is taken into the polyimide-based resin. Due to introduction of a bridged structure into the resin, the fluidity of the resin composition cured membrane in the heat treatment step is restrained, so that the increase in adhesive force can be curved. As the crosslinking agent, compounds that has two or more cross-linking functional groups selected from the group consisting of groups represented by General formula (6), an epoxy group, a maleimide group, an oxetane group, an isocyanate group, and an acryloyl group, are cited, and compounds having two or more groups represented by General formula (6) are preferable.

[Chem. 7]

(6)

$R^{47}$, in the case where a plurality of $R^{47}$ exists in the compound, may be individually the same or different, indicating hydrogen or an alkyl group whose carbon number is 1 to 10. As specific examples of the alkyl group, a methyl group, an ethyl group, a propyl group, an isopropyl group, a butyl group, a hexyl group and a decyl group are cited.

As specific examples of the methylol-based compound having two or more groups represented by General formula (6), melamine derivatives and urea derivatives (by Sanwa Chemical Co., Ltd.) as below are cited.

[Chem. 8]

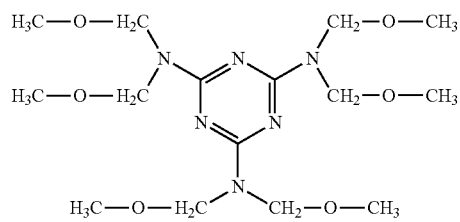

NIKALAC MW-30HM
NIKALAC MW-100LM

-continued

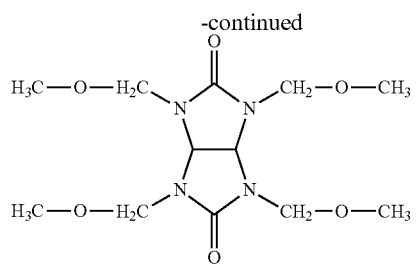

NIKALAC MX-270

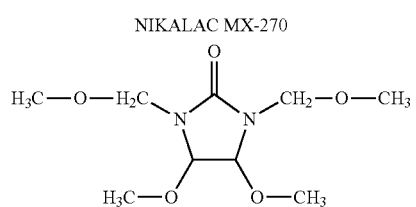

NIKALAC MX-280

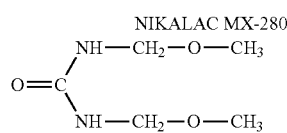

NIKALAC MX-290

In the invention, it is important that the resin composition contain a polyimide-based resin having a residue of a polysiloxane-based diamine represented by General formula (1) and a residue of an aromatic diamine having a hydroxyl group, and a methylol-based compound, whose amount is greater than or equal to 1 part by weight and, preferably, greater than or equal to 3 parts by weight, and less than equal to 20 parts by weight and, preferably, less than equal to 15 parts by weight, relative to 100 parts by weight of the polyimide-based resin. Since the methylol-based compound is contained at greater than or equal to 1 part by weight and less than or equal to 20 parts by weight, good tackiness can be obtained and the increase in adhesive force after passage through the heat treatment step can be greatly restrained, so that when the base material is to be peeled, the base material can easily be peeled off at room temperature.

In the resin composition of the invention, besides the polyimide-based resin and the methylol-based compound, other resins or fillers can be added in such a range that the effects of the invention are not impaired. As the other resins, there can be cited heat resistance high-molecular resins such as acryl-based resin, acrylonitrile-based resin, butadiene-based resin, urethane-based resin, polyester-based resin, polyamide-based resin, polyamide imide-based resin, epoxy-based resin, and phenol-based resin. As for filler, there are cited fine particles, fillers, etc., that are made up of organic or inorganic matters. As specific examples of the fine particle and the filler, there can be cited silica, alumina, titanium oxide, quartz powder, magnesium carbonate, potassium carbonate, barium sulfate, mica, talc, etc. Furthermore, a surface-active agent, a silane coupling agent, etc. may also be added for the purpose of improving characteristics such as tackiness, heat resistance, coating property, or preservation stability.

The cured membrane obtained by curing the resin composition of the invention is preferred to have a glass transition temperature less than or equal to 40° C., preferably, less than or equal to 30° C., and, more preferably, less than or equal to 20° C. If the glass transition temperature is less than or equal to 40° C., good tackiness is exhibited when a base material, which is a body to be attached, is pressure-bonded to the cured membrane formed by using the resin composition of the invention.

The tackiness mentioned herein indicates that there is provided an adhesive force greater than or equal to a degree such that the base material does not naturally peel when the tacky layer film has been pressure-bonded onto the base material at a room temperature of 20° C. to 30° C. Specifically, the tackiness mentioned indicates having an adhesive force greater than or equal to 1 g/cm when the base material, which is an attached body, is peeled at a peel angle of 90 degrees and at 50 mm/minute.

Furthermore, although there are no specific limitations on the lower limit of the glass transition temperature, the glass transition temperature is, preferably, greater than or equal to −30° C. and, more preferably, greater than or equal to −20° C. If the glass transition temperature is greater than or equal to −30° C., an appropriate tack property is provided; for example, after a protective film having subjected to a mold release treatment is stuck, the protective film can easily be peeled off.

The resin composition of the invention exhibits high heat resistance, and the decomposition start temperature thereof is greater than or equal to 250° C. and, preferably, greater than or equal to 300° C.

The laminate film of the invention is one that can be used mainly as a tackiness agent laminate film, and it can be obtained by laminating the resin composition of the invention on one surface or both surfaces of a heat resistant insulation film. The laminate film of the invention can also be used immediately as a tacky film. Furthermore, the laminate film of the invention can also be used as a tackiness agent transfer film that transfers the tackiness agent layer to a glass substrate or the like as only the heat resistant insulation film of the laminate film is peeled after the tackiness agent layer of the laminate film has been pressure-bonded to the glass substrate or the like.

As the heat resistant insulation film for use on the laminate film of the invention, films made of aromatic polyimide-based resin, polyphenylene sulfide-based resin, aromatic polyamide-based resin, polyamide imide-based resin, aromatic polyester-based resin, etc. can be cited, and a polyimide film made of aromatic polyimide-based resin is particularly preferable. Specific products of the polyimide film, there can be cited "Kapton" (registered trademark) by Toray-DuPont Co., Ltd., "Upilex" (registered trademark) by Ube Industries, Ltd., "APICAL" (registered trademark) by KANEKA CORPORATION, etc.

Although the thickness of the heat resistant insulation film is not particularly limited, the thickness is preferably greater than or equal to 3 μm, more preferably greater than or equal to 5 μm, and even more preferably greater than or equal to 10 μm, from the viewpoint of the strength as a support. Furthermore, from the viewpoint of flexibility, the thickness is preferably less than or equal to 150 μm, more preferably less than or equal to 75 μm, and even more preferably less than or equal to 50 μm.

As a coating method for the resin composition, there can be cited methods that use a bar coater, a roll coater, a knife coater, a comma coater, a reverse coater, a doctor-blade float coater, a gravure coater, a slit-die coater, etc. After coating, a heat treatment is carried out to remove the organic solvent in the resin composition and therefore conduct imidization. The heat treatment temperature is 100 to 300° C. and, preferably, 150 to 250° C. The heat treatment time is usually selected as appropriate from 20 seconds to 30 minutes, and it does not matter whether it is continuous or intermittent. In the case where the resin composition is laminated on both surfaces of the heat resistant insulation film, the resin composition may be coated and dried on one surface at time, or may also be coated and dried simultaneously on both surfaces. A mold release-treated film may be laminated on the surface of the coated resin composition according to need.

The thickness of the resin composition laminated may be selected as appropriate; however, the thickness thereof is preferably 0.1 μm to 500 μm, preferably 1 μm to 100 μm, and more preferably 2 μm to 50 μm.

When the laminate film of the invention is used as a tacky tape, one surface or both surfaces of the heat resistant insulation film may be subjected to an adhesiveness improvement treatment according to purpose. As the adhesiveness improvement treatment, an electric discharge treatment, such as a normal-pressure plasma treatment, a corona electric discharge treatment, or a low-temperature plasma treatment, is preferable.

To pressure-bond another base material to the tacky tape, a press, a roll laminator, etc. may be employed. The pressure bonding may be carried out by applying a temperature, which is less than or equal to 100° C. and, preferably, 80° C. The pressure bonding at a room temperature of 20 to 30° C. is the most preferable. The pressure bonding may be carried out in air or may also be carried out in nitrogen. Preferably, the pressure bonding is carried out in vacuum.

When the laminate film of the invention is used as a tackiness agent transfer film, one surface or both surfaces of the heat resistant insulation film may be subjected to a mold release treatment according to purpose. As the mold release treatment, a treatment by coating a silicone resin, a fluorine-based resin, etc., is preferable.

When the transfer is to be carried out, the resin composition layer of the laminate film is applied and pressure-bonded to a base material such as a glass substrate. For the pressure bonding, a press, a roll laminator, etc., can be employed; furthermore, heating may be performed for the pressure bonding if there is a need. The temperature at this time is greater than or equal to 20° C. and less than or equal to 200° C. and, preferably, less than or equal to 180° C. The pressure bonding may be performed in air or may also be performed in nitrogen. Preferably, the pressure bonding is performed in vacuum.

To pressure-bond another base material to the transferred resin composition layer, the pressure bonding is performed by using a press, a roll laminator, etc., after peeling the heat resistant insulation film. The pressure bonding may be performed by applying a temperature, which is less than 180° C. and, preferably, less than or equal to 100° C. The pressure bonding at a room temperature of 20 to 30° C. is the most preferable. The pressure bonding may be performed in air or may also be performed in nitrogen. Preferably, the pressure bonding is performed in vacuum.

In the invention, the resin composition may be directly coated to and dried on a glass substrate or the like. As a coating method, a spin coater, screen printing, a gravure coater, a slit die coater, a bar coater, etc., can be cited.

The resin composition of the invention can be used in production of semiconductor apparatuses as well. More specifically, the resin composition of the invention can be used in a technology that laminates the resin composition while connecting semiconductor chips by through silicon vias (TSVs: Through Silicon Vias) in order to make semiconductor elements more highly integrated and denser. This technology requires that the package be made thin, and includes a step of thinning the thickness of the semiconductor circuit-formed substrate to 100 μm or less. As the semiconductor circuit-formed substrate, a silicon wafer is typically used.

If a silicon wafer is made thin to 100 μm or less, it becomes difficult to transport the silicon wafer. Therefore, a substrate for forming a semiconductor circuit is adhered to a support substrate, such as a silicon wafer, via a tackiness agent or the like, and the non-circuit-formation surface (reverse surface) of the substrate for forming a semiconductor circuit is ground to thin the substrate. After a reverse surface electrode is formed on this reverse surface, the semiconductor circuit-formed substrate is peeled off. The resin composition of the invention can be suitably used as a tackiness agent in the production of a semiconductor apparatus that includes the foregoing step.

As methods for coating the resin composition to a support substrate, a spin coater, a roll coater, screen printing, a slit die coater, etc. can be cited. The drying after coating can be carried out by performing a heat treatment at 100 to 300° C. typically for 20 seconds to 1 hour continuously or intermittently. Alternatively, using a laminate film laminated by coating and drying the resin composition on a base material film having subjected to a mold release treatment, the coating membrane of the resin composition may be transferred to and laminated on a silicon wafer that is a support substrate. After the resin composition is laminated, a heat treatment may be further carried out at 180 to 350° C. for 30 seconds to 1 hour.

In the invention, not only lamination by coating the resin composition on a support substrate but lamination by coating the resin composition on a substrate for forming a semiconductor circuit may also be performed and a coating membrane of the resin composition may also be transferred and laminated, by using a laminate film, onto a substrate for forming a semiconductor circuit. Furthermore, on the support substrate side or the substrate-for-forming-a-semiconductor-circuit side, there may be present a layer made of another resin composition.

EXAMPLES

The invention will now be illustrated with reference to Examples, but the invention is not to be limited thereto. Evaluation methods for the glass transition temperature, the weight reduction rate, and the adhesive force will be described.

(1) Measurement of Glass Transition Temperature

Each of tackiness agent resin solutions (AH1 to AH27) mentioned with Production examples 22 to 48 below was coated by a bar coater onto a gloss surface of an electrolytic copper foil of 18 μm in thickness so that the thickness became 20 μm, and then was dried at 80° C. for 10 minutes and at 150° C. for 10 minutes. Furthermore, a heating treatment was performed at 250° C. in a nitrogen atmosphere for 10 minutes for conversion into polyimide, so that tackiness agent resin-laminated copper foils were obtained. Next, the copper foil of each obtained tackiness agent resin-laminated copper foil was subjected to entire-surface etching with a ferric chloride solution to obtain a simple membrane of the tackiness agent resin.

About 10 mg of each obtained simple membrane of the tackiness agent resin was loaded in a standard container made of aluminum, and was subjected to measurement (DSC method) by using a differential scanning calorimeter DSC-50 (by Shimadzu Corporation). From an inflection point of the obtained DSC curve, a glass transition temperature was calculated. After preliminary drying of 80° C.×1 hour, measurement was performed at a temperature rise speed of 20° C./minute.

(2) Measurement of Thermal Decomposition Start Temperature

About 15 mg of each simple membrane of the tackiness agent resin obtained as described above was loaded into a standard container made of aluminum, and was subjected to measurement by using a thermogravimetric analysis apparatus TGA-50 (by Shimadzu Corporation). As for the measurement condition, the temperature was held at 60° C. for 30 minutes, and then was raised to 500° C. at a temperature rise speed of 5° C./minute.

From the obtained weight reduction curve, a temperature of start of weight reduction was read out, and this temperature was determined as a thermal decomposition start temperature.

(3) Measurement of Tackiness Force (Normal State)

The polyimide film on a polyimide film-laminated glass substrate obtained in each of Examples and Comparative examples was provided with 10-mm-wide cutting, and a 10-mm-wide polyimide film was subjected to measurement under 90° peeling at a rate of pulling of 50 mm/minute, using a "Tensilon" UTM-4-100 by TOYO BOLDWIN company.

(4) Measurement of Average Molecular Weight of Polysiloxane-Based Diamine and Calculation of Numerical Value n 5 g of polysiloxane-based diamine that was to be a sample was taken into a beaker, and 50 mL of a mixture solution whose IPA:toluene was 1:1 was put thereinto and dissolved. Next, using an automatic potentiometric measurement apparatus AT-610 by Kyoto Electronics Manufacturing Co., Ltd., a 0.1-N hydrochloric acid aqueous solution was dropped while stirring was being performed, to determine the amount thereof dropped to achieve the neutralization point. From the obtained amount of 0.1-N hydrochloric acid aqueous solution dropped, an average molecular weight was calculated using Expression (7) below.

$$2\times[10\times36.5\times(\text{dropped amount (g)})]/5 = \text{average molecular weight} \quad (7)$$

Next, the molecular weights of polysiloxane-based diamine in the case where the polysiloxane-based diamine used was n=1 and in the case where the polysiloxane-based diamine used was n=10 were calculated from the chemical structural formula, and a relation between the numerical value of n and the molecular weight was found as a relational expression of a linear function. The aforementioned average molecular weight was substituted in this relational expression to fine an average value of n.

Abbreviated names for acid dianhydrides and diamines indicated Production examples below are as follows.
BPDA: 3,3',4,4'-biphenyl tetracarboxylic dianhydride
ODPA: 3,3',4,4'-diphenyl ether tetracarboxylic dianhydride
BTDA: 3,3',4,4'-benzophenone tetracarboxylic dianhydride
APPS1: α,ω-bis(3-aminopropyl)polydimethyl siloxane (average molecular weight: 400, n=3 in Expression (1))
APPS2: α,ω-bis(3-aminopropyl)polydimethyl siloxane (average molecular weight: 860, n=9 in Expression (1))
APPS3: α,ω-bis(3-aminopropyl)polydimethyl siloxane (average molecular weight: 1600, n=19 in Expression (1))
APPS4: α,ω-bis(3-aminopropyl)polydimethyl siloxane (average molecular weight: 3000, n=37 in Expression (1))
44DAE: 4,4'-diaminodiphenyl ether
APB: 1,3-bis(3-aminophenoxy)benzene
35DAP: 3,5-diaminophenol BAP: 4,4'-dihydroxy-3,3'-diaminophenyl propane
DABS: 4,4'-dihydroxy-3,3'-diaminophenyl sulfone
AHPB: 1,3-bis(4-amino-3-hydroxy phenyl)benzene
BAHF: 4,4'-dihydroxy-3,3'-diaminophenyl hexafluoropropane
BAHPS: bis(4-(3-amino-4-hydroxy phenoxy)benzene)sulfone
100LM: NIKALAC (registered trademark) MW-100LM (by Sanwa Chemical Col, Ltd.)
MX270: NIKALAC (registered trademark) MX-270 (by Sanwa Chemical Col, Ltd.)
NMP: N-methyl-2-pyrrolidone Production Example 1 (Polymerization of Polyamide Acid Solution)

After 320 g (0.8 mol) of APPS1, 20 g (0.1 mol) of 44DAE, 25.8 g (0.1 mol) of BAP were charged together with 1577 g of NMP into and were dissolved in a reaction tank equipped with a thermometer, a dry nitrogen introduction opening, a heating/cooling apparatus via warm water/cooling water, and a stirring apparatus, 310.2 g (1 mol) of ODPA was added to conduct a reaction at room temperature for 1 hour and at 60° C. for 5 hours, so that a 30-wt % polyamide acid resin solution (PA1) was obtained.

Production Examples 2 to 21 (Polymerization of Polyamide Acid Solution)

30-wt % polyamide acid resin solutions (PA2 to PA21) were obtained by performing substantially the same operation as in Production example 1, except that the kinds of acid dianhydride and diamine and the charged amounts were changed as in Table 1 and Table 2.

In Production example 4, the polymerization solution gelled at the time of polymerization of polyamide acid.

TABLE 1 upper row: composition ratio (mole %)/lower row: charged amount (g)

| | | Acid component | Diamine component | | | | | | Solvent |
|---|---|---|---|---|---|---|---|---|---|
| | | ODPA | APPS1 | APPS2 | APPS3 | APPS4 | 44DAE | BAP | NMP |
| Production example 1 | PA1 | 100 | 80 | | | | 10 | 10 | 3154 |
| | | 620.4 | 640.0 | | | | 40.0 | 51.6 | |
| Production example 2 | PA2 | 100 | | 80 | | | 10 | 10 | 2436 |
| | | 310.2 | | 688.0 | | | 20.0 | 25.8 | |
| Production example 3 | PA3 | 100 | | | 80 | | 10 | 10 | 3817 |
| | | 310.2 | | | 1280.0 | | 20.0 | 25.8 | |
| Production example 4 | PA4 | 100 | | | | 80 | 10 | 10 | 3216 |
| | | 155.1 | | | | 1200.0 | 10.0 | 12.9 | |
| Production example 5 | PA5 | 100 | 35 | | | | 55 | 10 | 3486 |
| | | 620.4 | 602.0 | | | | 220.2 | 51.6 | |
| Production example 6 | PA6 | 100 | 45 | | | | 45 | 10 | 3794 |
| | | 620.4 | 774.0 | | | | 90.0 | 51.6 | |
| Production example 7 | PA7 | 100 | 55 | | | | 35 | 10 | 2051 |
| | | 310.2 | 473.0 | | | | 35.0 | 25.8 | |
| Production example 8 | PA8 | 100 | 65 | | | | 25 | 10 | 2205 |
| | | 310.2 | 559.0 | | | | 50.1 | 25.8 | |
| Production example 9 | PA9 | 100 | 90 | | | | | 10 | 2590 |
| | | 310.2 | 774.0 | | | | | 25.8 | |
| Production example 10 | PA10 | 100 | 95 | | | | | 10 | 2660 |
| | | 310.2 | 817.0 | | | | | 25.8 | |
| Production example 11 | PA11 | 100 | | 80 | | | 20 | | 2423 |
| | | 310.2 | | 688.0 | | | 40.0 | | |
| Production example 12 | PA12 | 100 | | 80 | | | 15 | 5 | 2429 |
| | | 310.2 | | 688.0 | | | 30.0 | 12.9 | |
| Production example 13 | PA13 | 100 | | 80 | | | 5 | 15 | 2443 |
| | | 310.2 | | 688.0 | | | 10.0 | 38.8 | |
| Production example 14 | PA14 | 100 | | 60 | | | 15 | 25 | 2149 |
| | | 310.2 | | 516.0 | | | 30.0 | 64.6 | |
| Production example 15 | PA15 | 100 | | 60 | | | 5 | 35 | 2162 |
| | | 310.2 | | 516.0 | | | 10.0 | 90.4 | |
| Production example 16 | PA16 | 100 | | 55 | | | | 45 | 2099 |
| | | 310.2 | | 473.0 | | | | 116.3 | |

TABLE 2 upper row: composition ratio (mole %)/lower row: charged amount (g)

| | | Acid component | | | Diamine | | | | | | Solvent |
|---|---|---|---|---|---|---|---|---|---|---|---|
| | | ODPA | BPDA | BTDA | APPS2 | APB | DABS | AHPB | BAHF | 35DAP | BAHPS | NMP |
| Production example 17 | PA17 | 100 | | | 80 | 5 | 15 | | | | | 2461 |
| | | 310.2 | | | 688.0 | 14.6 | 42.0 | | | | | |
| Production example 18 | PA18 | | 100 | | 80 | 5 | | 15 | | | | 2439 |
| | | | 294.2 | | 688.0 | 14.6 | | 48.6 | | | | |
| Production | PA19 | | | 100 | 80 | 5 | | | 15 | | | 2519 |

TABLE 2-continued

| | | upper row: composition ratio (mole %)/lower row: charged amount (g) | | | | | | | | | |
|---|---|---|---|---|---|---|---|---|---|---|---|
| | | Acid component | | | Diamine | | | | | | Solvent |
| | | ODPA | BPDA | BTDA | APPS2 | APB | DABS | AHPB | BAHF | 35DAP | BAHPS | NMP |
| example 19 | | | | 322.2 | 688.0 | 14.6 | | | 54.9 | | | |
| Production | PA20 | | | 100 | 80 | 5 | | | | | 15 | 2391 |
| example 20 | | | | 322.2 | 688.0 | 14.6 | | | | 18.6 | | |
| Production | PA21 | | 100 | | 80 | 5 | | | | | 15 | 2326 |
| example 21 | | | 294.2 | | 688.0 | 14.6 | | | | | 69.7 | |

Production Example 22 (Preparation of Tackiness Agent Resin Solution)

100 g of the polyamide acid solution (PA1) obtained in Production example 1 and 5 g of 100LM, a methylol-based compound, were charged together with 11.7 g of NMP into a reaction tank equipped with a stirring apparatus, and were stirred at room temperature for 2 hours, so that a 30-wt % tackiness agent resin solution (AH1) was obtained.

Production Examples 23 to 47 (Preparation of Tackiness Agent Resin Solution)

30-wt % tackiness agent resin solutions (AH2 to 26) were obtained by performing substantially the same operation as in Production example 22, except that the kinds and charged amounts of the polyamide acid solution and the kinds and charged amounts of the methylol-based compound were changed as in Table 3.

In Production examples 25, because the polyamide acid solution (PA4) had been gelled, the tackiness agent resin solution was also gelled.

Example 1

The tackiness agent resin solution (AH2) obtained in Production example 23 was coated onto a 0.7-mm-thick nonalkali glass substrate (by Corning company) by a spin coater with its rotation speed adjusted so that the thickness after being dried and imidized became 10 μm, and was dried by performing a heat treatment at 120° C. for 10 minutes, and then was caused to undergo imidization by performing a heat treatment at 250° C. for 10 minutes, so that a tackiness agent resin-laminated glass substrate was obtained.

A polyimide film ("Kapton" 150EN by Toray-DuPont Co., LTD.) was laid on top of the tackiness agent resin-laminated glass substrate created by the above-described method, and the polyimide film was pressure-bonded on a 160° C. hot plate by using a hand roll, so that a polyimide film-laminated glass substrate was obtained. The obtained polyimide film-laminated glass substrate was heat-treated for 15 minutes in a hot air oven set to 300° C.

The post-pressure bonding and pre-heat treatment tackiness force and the post-heat treatment tackiness force of the obtained polyimide film-laminated glass substrate, and the glass transition temperature and the thermal decomposition start temperature of the tackiness agent resin were compiled in Table 4.

TABLE 3

| | | Polyamide acid solution | | Methylol-based compound | | NMP |
|---|---|---|---|---|---|---|
| | | Type | Charged amount (g) | Type | Charged amount (g) | (g) |
| Production example 22 | AH1 | PA1 | 100 | 100LM | 5 | 11.7 |
| Production example 23 | AH2 | PA2 | 100 | 100LM | 5 | 11.7 |
| Production example 24 | AH3 | PA3 | 100 | 100LM | 5 | 11.7 |
| Production example 25 | AH4 | PA4 | 100 | 100LM | 5 | 11.7 |
| Production example 26 | AH5 | PA5 | 100 | 100LM | 5 | 11.7 |
| Production example 27 | AH6 | PA6 | 100 | 100LM | 5 | 11.7 |
| Production example 28 | AH7 | PA7 | 100 | 100LM | 5 | 11.7 |
| Production example 29 | AH8 | PA8 | 100 | 100LM | 5 | 11.7 |
| Production example 30 | AH9 | PA9 | 100 | 100LM | 5 | 11.7 |
| Production example 31 | AH10 | PA10 | 100 | 100LM | 5 | 11.7 |
| Production example 32 | AH11 | PA11 | 100 | 100LM | 5 | 11.7 |
| Production example 33 | AH12 | PA12 | 100 | 100LM | 5 | 11.7 |
| Production example 34 | AH13 | PA13 | 100 | 100LM | 5 | 11.7 |
| Production example 35 | AH14 | PA14 | 100 | 100LM | 5 | 11.7 |
| Production example 36 | AH15 | PA15 | 100 | 100LM | 5 | 11.7 |
| Production example 37 | AH16 | PA16 | 100 | 100LM | 5 | 11.7 |
| Production example 38 | AH17 | PA17 | 100 | 100LM | 2 | 4.7 |
| Production example 39 | AH18 | PA17 | 100 | 100LM | 5 | 11.7 |
| Production example 40 | AH19 | PA17 | 100 | 100LM | 10 | 23.3 |
| Production example 41 | AH20 | PA17 | 100 | 100LM | 17 | 39.7 |
| Production example 42 | AH21 | PA17 | 100 | 100LM | 25 | 58.3 |
| Production example 43 | AH22 | PA18 | 100 | 100LM | 10 | 23.3 |
| Production example 44 | AH23 | PA19 | 100 | 100LM | 10 | 23.3 |
| Production example 45 | AH24 | PA20 | 100 | 100LM | 10 | 23.3 |
| Production example 46 | AH25 | PA21 | 100 | 100LM | 10 | 23.3 |
| Production example 47 | AH26 | PA17 | 100 | MX270 | 10 | 23.3 |

Example 2

A polyimide film-laminated glass substrate was obtained by performing substantially the same operation as in Example 1, except that the tackiness agent resin solution was changed as in Table 4.

The post-pressure bonding and pre-heat treatment tackiness force and the post-heat treatment tackiness force of the obtained polyimide film-laminated glass substrate, and the glass transition temperature and the thermal decomposition start temperature of the tackiness agent resin were compiled in Table 4.

Comparative Examples 1 to 4

Polyimide film-laminated glass substrates were obtained by performing substantially the same operation as in Example 1, except that the tackiness agent resin solution was changed as in Table 4.

The post-pressure bonding and pre-heat treatment tackiness forces and the post-heat treatment tackiness forces of the obtained polyimide film-laminated glass substrates, and the glass transition temperatures and the thermal decomposition start temperatures of the tackiness agent resins were compiled in Table 4.

In Comparative example 2, the tackiness agent resin solution (AH4) was gelled, so that a uniform cured membrane could not be obtained.

As in Examples, since the resin composition contained a polyimide-based resin and a methylol-based compound and the polyimide-based resin had a residue of a polysiloxane-based diamine where n indicate a range of 5 to 30 in General formula (1) and a residue of an aromatic diamine having a hydroxyl group, a good tackiness force was obtained after the pressure bonding, and the increase in tackiness force was small even after the 300° C. treatment, and the polyimide film, which was a base material, was able to be easily peeled off at room temperature.

In Comparative examples, when either a residue of an aromatic diamine having a hydroxyl group in the polyimide-based resin or a methylol-based compound in the resin composition was absent, the adhesive force with the polyimide film that was a base material greatly increased after the 300° C. treatment, so that the polyimide film could not peeled off at room temperature. Furthermore, when n was less than or equal to 5 in the polysiloxane-based diamine represented by General formula (1), the tackiness force with the polyimide film that was a base material was substantially null. When n was greater than or equal to 30, gelation occurred during polymerization of polyamide acid, so that a uniform cured membrane could not be obtained.

Examples 3 to 8

Polyimide film-laminated glass substrates were obtained by performing substantially the same operation as in Example 1, except that the tackiness agent resin solution was changed as in Table 5.

The post-pressure bonding and pre-heat treatment tackiness forces and the post-heat treatment tackiness forces of the obtained polyimide film-laminated glass substrates, and the glass transition temperatures and the thermal decomposition start temperatures of the tackiness agent resins were compiled in Table 5.

TABLE 4

| | Tackiness agent resin solution | Content of OH group-containing diamine in polyimide composition (mol %) | Value of n in General formula (1) | Parts by weight of methylol-based compound to 100 parts by weight of polyamide acid solution | Glass transition temperature (° C.) | Thermal decomposition start temperature (° C.) | Tackiness force (g/cm) | |
|---|---|---|---|---|---|---|---|---|
| | | | | | | | Post-pressure bonding and pre-heat treatment | post-heat treatment |
| Example 1 | AH2 | 10 | 9 | 5 | 15 | >300 | 25 | 50 |
| Example 2 | AH3 | 10 | 19 | 5 | 15 | >300 | 25 | 50 |
| Comparative example 1 | AH1 | 10 | 3 | 5 | 70 | >300 | 0 | — |
| Comparative example 2 | AH4 | 10 | 37 | 5 | — | — | — | — |
| Comparative example 3 | AH11 | 0 | 9 | 5 | 10 | >300 | 30 | >500 |
| Comparative example 4 | PA17 | 15 | 9 | 0 | 10 | >300 | 40 | >500 |

TABLE 5

| | Tackiness agent resin solution | Content of polysiloxane diamine in polyimide composition (mol %) | Glass transition temperature (° C.) | Thermal decomposition start temperature (° C.) | Tackiness force (g/cm) | |
|---|---|---|---|---|---|---|
| | | | | | Post-pressure bonding and pre-heat treatment | post-heat treatment |
| Example 3 | AH5 | 35 | 64 | >300 | 2 | 50 |
| Example 4 | AH6 | 45 | 48 | >300 | 10 | 50 |

TABLE 5-continued

|  | Tackiness agent resin solution | Content of polysiloxane diamine in polyimide composition (mol %) | Glass transition temperature (° C.) | Thermal decomposition start temperature (° C.) | Tackiness force (g/cm) Post-pressure bonding and pre-heat treatment | Tackiness force (g/cm) post-heat treatment |
|---|---|---|---|---|---|---|
| Example 5 | AH7 | 55 | 42 | >300 | 15 | 50 |
| Example 6 | AH8 | 65 | 31 | >300 | 25 | 50 |
| Example 1 | AH2 | 80 | 15 | >300 | 25 | 50 |
| Example 7 | AH9 | 90 | −2 | >300 | 25 | 60 |
| Example 8 | AH10 | 95 | −4 | >300 | 15 | 80 |

With regard to the polyimide-based resin contained in the resin composition, when the content of the residue of polysiloxane-based diamine in the polyimide-based resin was greater than or equal to 40 mol %, good tackiness was exhibited. Furthermore, when the content of the residue of the polysiloxane-based diamine was 60 to 90 mol %, good tackiness was exhibited, and also the increase in the tackiness force after the heat treatment was small, and good exfoliative was exhibited as well.

Examples 9 to 13

Polyimide film-laminated glass substrates were obtained by performing substantially the same operation as in Example 1, except that the tackiness agent resin solution was changed as in Table 6.

The post-pressure bonding and pre-heat treatment tackiness forces and the post-heat treatment tackiness forces of the obtained polyimide film-laminated glass substrates, and the glass transition temperatures and the thermal decomposition start temperatures of the tackiness agent resins were compiled in Table 6.

aromatic diamine having a hydroxyl group in the polyimide-based resin was 1 to 40 mol %, good tackiness was exhibited, and the increase in the tackiness force after the heat treatment was small, and good exfoliative was exhibited as well.

Examples 14 to 18

Polyimide film-laminated glass substrates were obtained by performing substantially the same operation as in Example 1, except that the tackiness agent resin solution was changed as in Table 7.

The post-pressure bonding and pre-heat treatment tackiness forces and the post-heat treatment tackiness forces of the obtained polyimide film-laminated glass substrates, and the glass transition temperatures and the thermal decompo-

TABLE 6

|  | Tackiness agent resin solution | Polyimide composition Content of polysiloxane diamine (mol %) | Polyimide composition Content of OH group-containing diamine (mol %) | Glass transition temperature (° C.) | Thermal decomposition start temperature (° C.) | Tackiness force (g/cm) Post-pressure bonding and pre-heat treatment | Tackiness force (g/cm) post-heat treatment |
|---|---|---|---|---|---|---|---|
| Example 9 | AH12 | 80 | 5 | 14 | >300 | 25 | 50 |
| Example 1 | AH2 | 80 | 10 | 15 | >300 | 25 | 50 |
| Example 10 | AH13 | 80 | 15 | 15 | >300 | 25 | 50 |
| Example 11 | AH14 | 60 | 25 | 37 | >300 | 25 | 50 |
| Example 12 | AH15 | 60 | 35 | 39 | >300 | 20 | 50 |
| Example 13 | AH16 | 55 | 45 | 48 | >300 | 5 | 50 |

With regard to the polyimide-based resin contained in the resin composition, when the content of the residue of the sition start temperatures of the tackiness agent resins were compiled in Table 7.

TABLE 7

|  | Tackiness agent resin solution | Polyamide acid solution Type | Polyamide acid solution Content of OH group-containing diamine (mol %) | Parts by weight of methylol-based compound to 100 parts by weight of polyamide acid solution | Glass transition temperature (° C.) | Thermal decomposition start temperature (° C.) | Tackiness force (g/cm) Post-pressure bonding and pre-heat treatment | Tackiness force (g/cm) post-heat treatment |
|---|---|---|---|---|---|---|---|---|
| Example 14 | AH17 | PA17 | 15 | 2 | 10 | >300 | 40 | 80 |
| Example 15 | AH18 | PA17 | 15 | 5 | 12 | >300 | 35 | 40 |
| Example 16 | AH19 | PA17 | 15 | 10 | 15 | >300 | 30 | 30 |
| Example 17 | AH20 | PA17 | 15 | 17 | 14 | >300 | 20 | 20 |

TABLE 7-continued

|  | Polyamide acid solution | | Parts by weight of methylol-based compound to 100 parts by weight of polyamide acid solution | Glass transition temperature (° C.) | Thermal decomposition start temperature (° C.) | Tackiness force (g/cm) | |
|---|---|---|---|---|---|---|---|
|  | Tackiness agent resin solution | Type | Content of OH group-containing diamine (mol %) | | | | Post-pressure bonding and pre-heat treatment | post-heat treatment |
| Example 18 | AH21 | PA17 | 15 | 25 | 20 | >300 | 5 | 5 |
| Comparative example 4 | PA17 | PA17 | 15 | 0 | 10 | >300 | 40 | >500 |

When the content of the methylol-based compound contained in the resin composition was 1 to 20 parts by weight relative to 100 parts by weight of the polyimide-based resin, good tackiness was exhibited, and the increase after the tackiness force after the heat treatment was small, and good exfoliative was exhibited as well.

Examples 19 to 23

Polyimide film-laminated glass substrates were obtained by performing substantially the same operation as in Example 1, except that the tackiness agent resin solution was changed as in Table 8.

The post-pressure bonding and pre-heat treatment tackiness forces and the post-heat treatment tackiness forces of the obtained polyimide film-laminated glass substrates, and the glass transition temperatures and the thermal decomposition start temperatures of the tackiness agent resins were compiled in Table 8.

predetermined size, the PET film that was the protective film was peeled, and a nonalkali glass substrate (by Corning company) of 0.7 mm in thickness was placed on a hot plate whose hot plate surface temperature was set to 120° C., and the tackiness agent resin laminate film was pressure-bonded with a hand roll. Next, the polyimide film was peeled off to obtain a tackiness agent resin-laminated glass substrate. The peel surface of the peeled polyimide film was observed, and no residue of the tackiness agent resin was present on the surface.

A polyimide film ("Kapton" 150EN by Toray-DuPont Co., LTD.) was laid on top of the tackiness agent resin-laminated glass substrate created by the above-described method, and the polyimide film was pressure-bonded at 160° C. by using a hand roll, so that a polyimide film-laminated glass substrate was obtained. The tackiness force of the obtained polyimide film-laminated glass substrate was 32 g/cm. Next, the polyimide film-laminated glass substrate was heat-treated at 300° C. for 15 minutes by using a hot air

TABLE 8

|  | Polyamide acid solution | | | Methylol-based compound | | Glass transition temperature (° C.) | Thermal decomposition start temperature (° C.) | Tackiness force (g/cm) | |
|---|---|---|---|---|---|---|---|---|---|
|  | Tackiness agent resin solution | Type | Content of OH group-containing diamine (mol %) | Type | Parts by weight to 100 parts by weight of polyamide acid solution | | | Post-pressure bonding and pre-heat treatment | post-heat treatment |
| Example 19 | AH22 | PA18 | 15 | 100LM | 10 | 18 | >300 | 25 | 25 |
| Example 20 | AH23 | PA19 | 15 | 100LM | 10 | 17 | >300 | 25 | 25 |
| Example 21 | AH24 | PA20 | 15 | 100LM | 10 | 17 | >300 | 25 | 25 |
| Example 22 | AH25 | PA21 | 15 | 100LM | 10 | 16 | >300 | 25 | 25 |
| Example 23 | AH26 | PA17 | 15 | MX270 | 10 | 15 | >300 | 40 | 40 |

Example 24

After the tackiness agent resin solution (AH19) obtained in Production example 40 was coated by a comma coater onto a polyimide film ("Kapton" 300H by Toray-DuPont Co., LTD.) of 100 μm in thickness and 250 mm in width having been subjected to a mold release treatment with silicon resin so that the membrane thickness after the drying and imidization became 15 μm, a heat treatment was performed at 120° C. for 1 minute and subsequently at 250° C. for 1 minute, so that a tackiness agent resin laminate film having a tackiness agent resin layer on one surface was obtained. Next, a PET film of 38 μm in thickness and 250 mm in width having been subjected to as mold release treatment with silicone resin was laminated at 25° C. on the tackiness agent resin layer, so that a tackiness agent resin laminate film with a protective film was obtained.

After the protective film-equipped tackiness agent resin laminate film obtained as described above was cut into a oven. The post-heat treatment tackiness force was 30 g/cm, and the polyimide film was able to be easily peeled off at room temperature.

Example 25

After the tackiness agent resin solution (AH19) obtained in Production example 40 was coated by using a spin coater onto a 6-inch silicon wafer of 750 μm in thickness so that the membrane thickness after the drying and imidization became 15 μm, a heat treatment was performed at 140° C. for 10 minutes and subsequently at 250° C. for 30 minutes, so that a tackiness agent resin-laminated support substrate was obtained.

A 6-inch silicon wafer of 750 μm in thickness was stuck to the aforementioned tackiness agent resin-laminated support substrate, that is, onto the tackiness agent resin laminate, and was pressure-bonded for 120 seconds under the conditions of 200° C. and 0.5 MPa, so that a laminate of a substrate for forming a semiconductor circuit/a tackiness agent resin layer/a support substrate was obtained.

The substrate for forming a semiconductor circuit of the laminate was set in a grinder DAG810 (by DISCO), and the substrate for forming a semiconductor circuit was grounded to a thickness of 100 μm. After the substrate for forming a semiconductor circuit was grounded, the laminate was heat-treated at 300° C. for 1 hour. The substrate for forming a semiconductor circuit in the laminate was observed by naked eye, and none of swell, fracture, crank, etc., was present.

Next, a dicing tape was stuck to the substrate for forming a semiconductor circuit by using a dicing frame, and the dicing tape surface was set on a suction pad by vacuum adsorption. Then, the support substrate was peeled off by picking up a portion of the support substrate at room temperature. The substrate for forming a semiconductor circuit had no fracture, crack, etc.

Example 26

A 6-inch silicon wafer of 750 μm in thickness was used. The PET film that was a protective film of the protective film-equipped tackiness agent resin laminate film manufactured in Example 24 was peeled off, and then the 6-inch silicon wafer of 750 μm in thickness was placed on a hot plate whose hot plate surface temperature was set to 120° C., and the tackiness agent resin laminate film was pressure-bonded by a hand roll. Next, the polyimide film was peeled off, and a heat treatment was performed at 250° C. for 30 minutes, so that a tackiness agent resin-laminated support substrate was obtained.

After that, substantially the same operation as in Example 25 was performed. After the support substrate was peeled, the substrate for forming a semiconductor circuit did not have a fracture, a crack, etc.

The invention claimed is:
1. A resin composition containing a polyimide-based resin and a methylol-based compound, wherein
the polyimide-based resin has an acid dianhydride residue and a diamine residue;
the diamine residue is at least a residue of a polysiloxane-based diamine represented by general formula (1) and a residue of an aromatic diamine having an hydroxyl group,

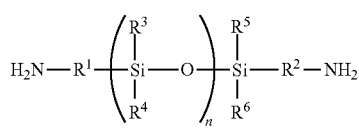
(1)

wherein n is a natural number, and an average value thereof calculated from an average molecular weight of the polysiloxane-based diamine is in a range of 5 to 30, $R^1$ and $R^2$ may be individually the same or different and indicate an alkylene group or a phenylene group having a carbon number that is 1 to 30, $R^3$ to $R^6$ may be individually the same or different and indicate an alkyl group, a phenyl group or a phenoxy group having a carbon number that is 1 to 30; and
the resin composition has a glass transition temperature after curing that is less than or equal to 40° C.

2. The resin composition according to claim 1, containing as the diamine residue the residue of the polysiloxane-based diamine represented by general formula (1) at greater than or equal to 40 mol % in a total amount of the diamine residue.

3. The resin composition according to claim 1, containing as the diamine residue the residue of the aromatic diamine having a hydroxyl group at 1 to 40 mol % in a total amount of the diamine residue.

4. The resin composition according to claim 3, wherein the aromatic diamine having an hydroxyl group is an aromatic diamine represented by any one of General formulas (2) to (5) below:

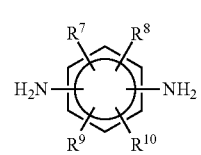
(2)

wherein at least one of $R^7$ to $R^{10}$ is a hydroxyl group, and the others may be the same or different, indicating a group selected from a hydrogen atom, an alkyl group having a carbon number that is 1 to 30, an alkoxy group having a carbon number that is 1 to 30, a halogen, a carboxyl group, a sulfone group, a nitro group, and a cyano group;

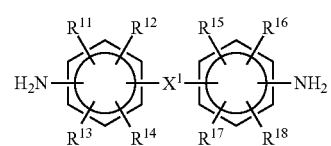
(3)

wherein $X^1$ indicates a group selected from a direct bond, O, S, SO, $SO_2$, CO, $CH_2$, $C(CH_3)_2$ and $C(CF_3)_2$, at least one of $R^{11}$ to $R^{18}$ is a hydroxyl group, and the others may be the same or different, indicating a group selected from a hydrogen atom, an alkyl group having a carbon number that is 1 to 30, an alkoxy group having a carbon number that is 1 to 30, a halogen, a carboxyl group, a sulfone group, a nitro group, and a cyano group;

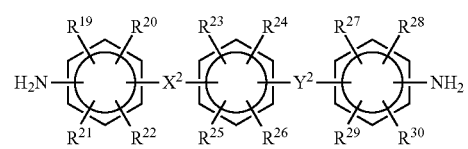
(4)

wherein $X^2$ and $Y^2$ may be individually the same or different, indicating a group selected from a direct bond, O, S, SO, $SO_2$, CO, $CH_2$, $C(CH_3)_2$ and $C(CF_3)_2$, at least one of $R^{19}$ to $R^{30}$ is a hydroxyl group, and the others may be the same or different, indicating a group selected from a hydrogen atom, an alkyl group having a carbon number that is 1 to 30, an alkoxy group having a carbon number that is 1 to 30, a halogen, a carboxyl group, a sulfone group, a nitro group, and a cyano group;

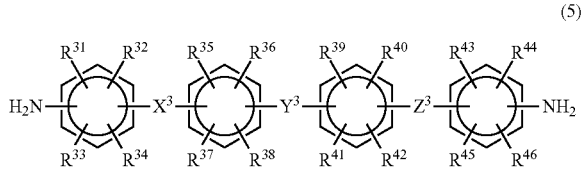
(5)

wherein $X^3$, $Y^3$ and $Z^3$ may be individually the same or different, indicating a group selected from a direct bond, O, S, SO, $SO_2$, CO, $CH_2$, $C(CH_3)_2$ and $C(CF_3)_2$, at least one of $R^{31}$ to $R^{46}$ is a hydroxyl group, and the others may be the same or different, indicating a group selected from a hydrogen atom, an alkyl group having a carbon number that is 1 to 30, an alkoxy group having a carbon number that is 1 to 30, a halogen, a carboxyl group, a sulfone group, a nitro group, and a cyano group.

5. The resin composition according to claim 1, wherein the aromatic diamine having an hydroxyl group is an aromatic diamine represented by any one of General formulas (2) to (5) below:

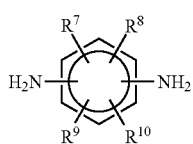
(2)

wherein at least one of $R^7$ to $R^{10}$ is a hydroxyl group, and the others may be the same or different, indicating a group selected from a hydrogen atom, an alkyl group having a carbon number that is 1 to 30, an alkoxy group having a carbon number that is 1 to 30, a halogen, a carboxyl group, a sulfone group, a nitro group, and a cyano group;

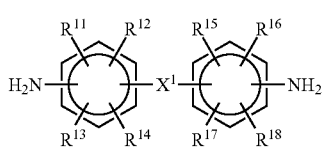
(3)

wherein $X^1$ indicates a group selected from a direct bond, O, S, SO, $SO_2$, CO, $CH_2$, $C(CH_3)_2$ and $C(CF_3)_2$, at least one of $R^{11}$ to $R^{18}$ is a hydroxyl group, and the others may be the same or different, indicating a group selected from a hydrogen atom, an alkyl group having a carbon number that is 1 to 30, an alkoxy group having a carbon number that is 1 to 30, a halogen, a carboxyl group, a sulfone group, a nitro group, and a cyano group;

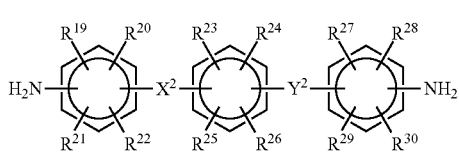
(4)

wherein $X^2$ and $Y^2$ may be individually the same or different, indicating a group selected from a direct bond, O, S, SO, $SO_2$, CO, $CH_2$, $C(CH_3)_2$ and $C(CF_3)_2$, at least one of $R^{19}$ to $R^{30}$ is a hydroxyl group, and the others may be the same or different, indicating a group selected from a hydrogen atom, an alkyl group having a carbon number that is 1 to 30, an alkoxy group having a carbon number that is 1 to 30, a halogen, a carboxyl group, a sulfone group, a nitro group, and a cyano group;

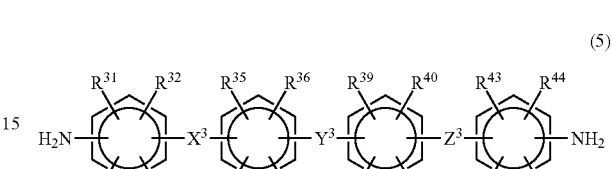
(5)

wherein $X^3$, $Y^3$ and $Z^3$ may be individually the same or different, indicating a group selected from a direct bond, O, S, SO, $SO_2$, CO, $CH_2$, $C(CH_3)_2$ and $C(CF_3)_2$, at least one of $R^{31}$ to $R^{46}$ is a hydroxyl group, and the others may be the same or different, indicating a group selected from a hydrogen atom, an alkyl group having a carbon number that is 1 to 30, an alkoxy group having a carbon number that is 1 to 30, a halogen, a carboxyl group, a sulfone group, a nitro group, and a cyano group.

6. The resin composition according to claim 1, wherein the methylol-based compound is a compound having two or more groups represented by general formula (6)

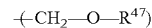
(6)

wherein $R^{47}$, in the case where a plurality of $R^{47}$ exists in the compound, may be individually the same or different, indicating hydrogen or an alkyl group having a carbon number that is 1 to 10.

7. The resin composition according claim 1, wherein a content of the methylol-based compound is 1 to 20 parts by weight relative to 100 parts by weight of the polyimide-based resin.

8. The resin composition according to claim 1, wherein the acid dianhydride residue is a residue of an aromatic tetracarboxylic dianhydride.

9. A cured membrane obtained by curing the resin composition according to claim 1.

10. A laminate film obtained by laminating the resin composition according to claim 1 on at least one surface of a heat resistant insulation film.

11. The laminate film according to claim 10, wherein the surface of the heat resistant insulation film has been subjected to a mold release treatment.

12. The laminate film according to claim 10, obtained by further laminating a heat resistant insulation film having been subjected to a mold release treatment on a surface of the resin composition having been laminated on at least one surface of the heat resistant insulation film.

13. A cured membrane obtained by curing the resin composition according to claim 2.

14. A cured membrane obtained by curing the resin composition according to claim 3.

15. A cured membrane obtained by curing the resin composition according to claim 5.

* * * * *